United States Patent [19]
Kern

[11] Patent Number: 5,872,706
[45] Date of Patent: Feb. 16, 1999

[54] CIRCUIT ARRANGEMENT FOR MULTIPLE USE OF A TRANSFORMER CORE

[75] Inventor: Robert Kern, Sasbachwalden, Germany

[73] Assignee: Robert Bosch GmbH, Stuttgart, Germany

[21] Appl. No.: 817,532

[22] PCT Filed: May 14, 1996

[86] PCT No.: PCT/DE96/00849

§ 371 Date: Apr. 23, 1997

§ 102(e) Date: Apr. 23, 1997

[87] PCT Pub. No.: WO97/11529

PCT Pub. Date: Mar. 27, 1997

[30] Foreign Application Priority Data

Sep. 20, 1995 [DE] Germany .................. 195 34 888.5

[51] Int. Cl.$^6$ .................. H02M 3/335; H02M 1/12; H02M 7/538
[52] U.S. Cl. .................. 363/24; 363/41; 363/133
[58] Field of Search .................. 363/24, 25, 26, 363/41, 133, 134

[56] References Cited

U.S. PATENT DOCUMENTS

| | | | |
|---|---|---|---|
| 3,590,362 | 6/1971 | Kakalec | 363/24 |
| 3,670,234 | 6/1972 | Joyce | 363/26 |
| 3,683,208 | 8/1972 | Burens | 363/26 |
| 3,970,916 | 7/1976 | Kienscherf | 363/26 |
| 4,244,015 | 1/1981 | Beebe | 363/41 |
| 4,591,964 | 5/1986 | Kemstedt | 363/24 |
| 4,748,532 | 5/1988 | Commander et al. | 361/31 |
| 4,767,948 | 8/1988 | Rainer | 327/109 |
| 4,905,136 | 2/1990 | Tanaka | 363/26 |
| 5,459,650 | 10/1995 | Noro | 363/24 |

FOREIGN PATENT DOCUMENTS

| | | | |
|---|---|---|---|
| A 0 245 763 | 11/1987 | European Pat. Off. | H03K 17/689 |
| A 2 684 500 | 6/1993 | France | H02M 1/08 |
| A 38 06 983 | 9/1989 | Germany | H02M 3/28 |
| A 2 109 184 | 5/1983 | United Kingdom | H02K 17/00 |

*Primary Examiner*—Edward H. Tso
*Assistant Examiner*—Bao Q. Vu
*Attorney, Agent, or Firm*—Venable; George H. Spencer; Robert Kinberg

[57] ABSTRACT

A circuit arrangement for multiple use of a transformer core, comprising a winding with center tap on the primary side and two separate windings on the secondary side, has a controlled switch in each feed line for the two primary windings which is preferably clocked with high frequency. A rectifier is connected to the first secondary winding in particular for forming a switching power supply, which is thus supplied with energy. An FET transistor is coupled to the second secondary winding, in particular for forming a driving pulse transmission, preferably via two Z-diodes with anti-serial connection, which transistor is thus supplied with driving pulses. The magnetic circuit for the transformer is actuated via switches which change polarities on the primary side of the transformer. The switch-on pulse duty factor for the switches is selected to be higher than 50%.

10 Claims, 2 Drawing Sheets

CIRCUIT ARRANGEMENT FOR MULTIPLE USE OF A TRANSFORMER CORE

BACKGROUND AND SUMMARY OF THE INVENTION

The invention is based on a circuit arrangement for multiple use of a transformer core of the generic type defined in the Preamble to claim 1.

From the DE 36 16 097 A1, a circuit arrangement is known for actuating one or several power field effect transistors in the switching mode with potential separation through a transformer. The transformer has two secondary windings. The first secondary winding is connected to the control electrode of a first driving transistor connected to positive voltage, and the second secondary winding is connected to a second driving transistor connected to negative voltage or ground potential. The two driving transistors are connected to the gate of the power field effect transistor. The primary winding of the transformer can be admitted with currents flowing in opposite direction, depending on whether the power field effect transistor must be switched on or switched off.

This known circuit arrangement has a transformer, to be sure, which has a primary side winding with center tap and two separate windings on the secondary side, wherein a controlled switch in the form of a transistor is provided in each feed line for the two primary windings. However, it only functions as driving circuit for switching a power field effect transistor on and off.

The invention at hand strives for and achieves a multiple use of an existing transformer by supplying a consumer with energy as well as transmitting drive pulses. This is not the case for the known circuit arrangement.

In contrast, the inventive circuit arrangement for multiple use of a transformer core has the advantage of saving a second inductive element. This results in space and cost savings and thus reduces the necessary total expenditure.

According to the invention, this is generally achieved in that a rectifier is connected to a first secondary winding, in particular for forming a switching power supply which is supplied with energy, and that an FET transistor is connected to a second secondary winding, in particular for forming a drive pulse transmission, which is thus supplied with drive pulses, and that the magnetic circuit for the transformer is actuated from the primary side by different poles.

For a particularly useful embodiment of the invention, the pulse duty factor for switching on the controlled switches is selected to be higher than 50% in the feed lines for the primary windings. It is advantageous if the pulse duty factor for switching on is around 80%.

According to an advantageous modification of the invention, which leads in particular to small structural shapes for the components and thus results in a space saving, the clocking is with high frequency, for example with a frequency of several 100 kHz. In this case, it makes sense if respectively one of the controlled switches in the feed lines to the two primary windings is clocked in a suitable manner.

In accordance with a preferred and advantageous embodiment of the invention, the FET transistor is linked to the second secondary winding via the in-series connection of two Z-diodes with connected cathodes.

If the gate source capacity of the FET transistor is too small, a capacitor can be connected in an advantageous modification of the invention between the gate and the source terminal of the FET transistor.

As a result of the advantageous embodiment of the invention, the FET transistor that is connected to the second secondary winding can be electrically floating.

The inventive circuit arrangement is provided for a particularly advantageous use when generating an independent, stabilized supply voltage and to actuate an electrically floating FET transistor, in particular a MOSFET transistor.

In another useful application, the inventive circuit arrangement is used for control devices for high-pressure gas discharge lamps, in particular in motor vehicle headlamps.

BRIEF DESCRIPTION OF THE DRAWING

The invention is explained in more detail in the following with the aid of an exemplary embodiment shown in the drawing.

Shown are in.

DETAILED DESCRIPTION OF THE INVENTION

Figure 1:
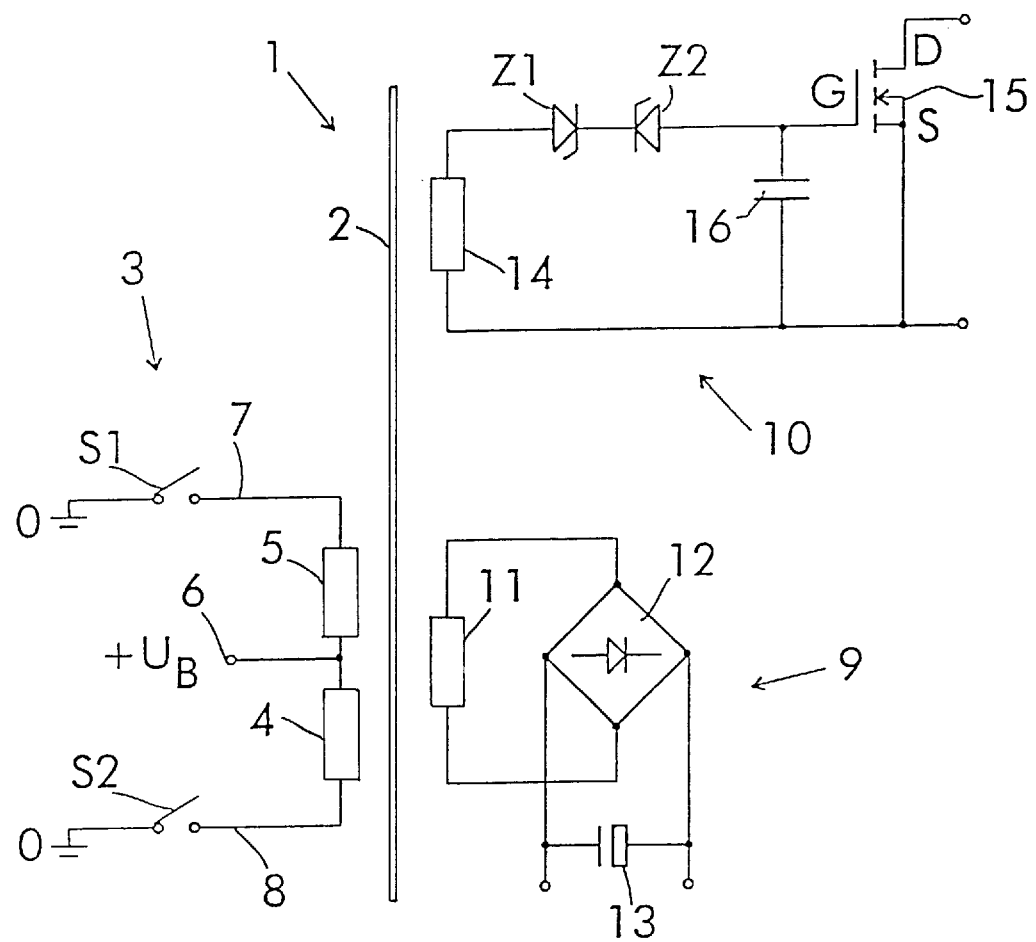
FIG. 1 A diagram of the basic circuit layout of the inventive circuit arrangement, and FIG. 2 Signal and voltage curves at the various circuit components according to an embodiment that is dimensioned in a specific way.
Figure 2:
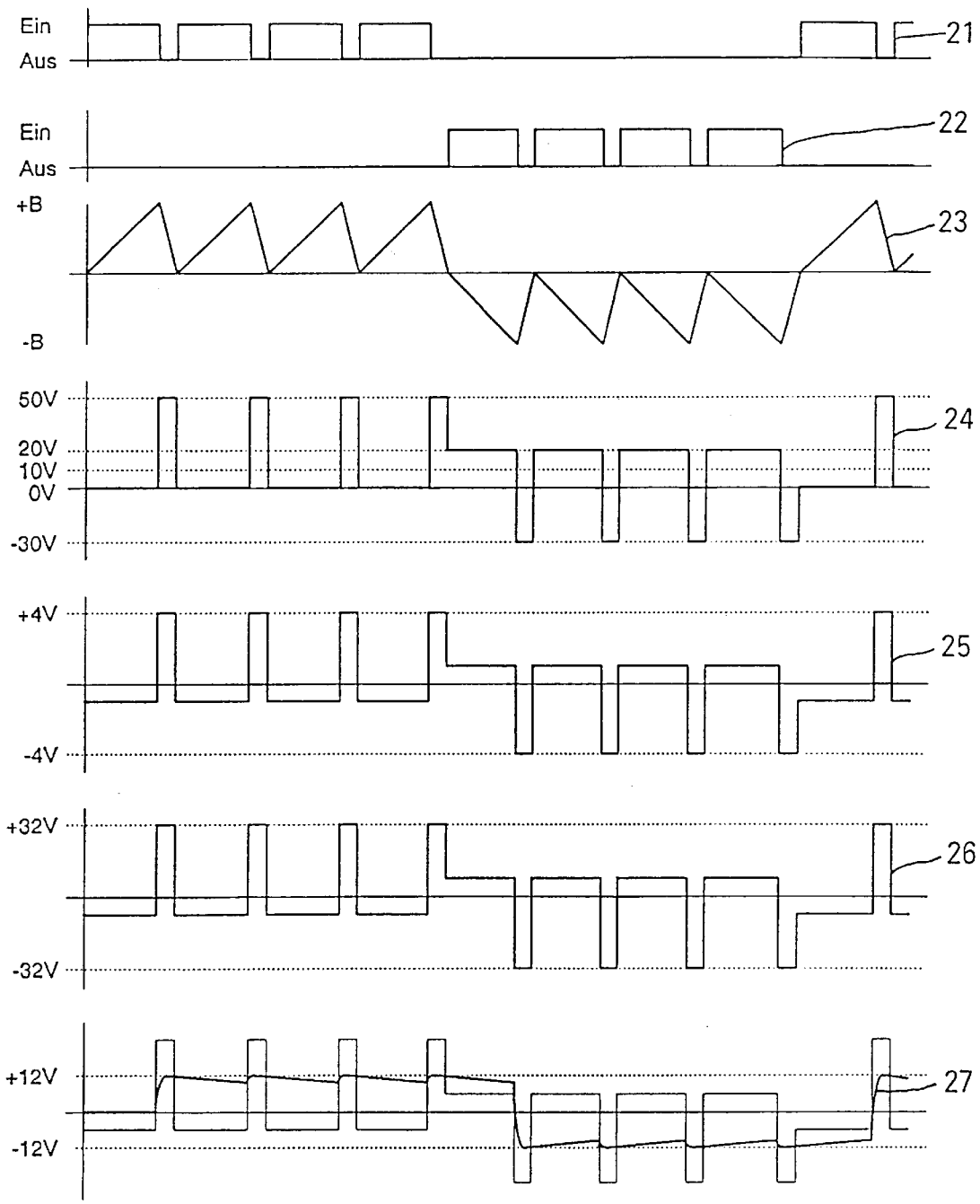

With the aid of the basic layout of the inventive circuit arrangement, shown as diagram in FIG. 1, and of the signal and voltage curves at various circuit components, based on an embodiment that is dimensioned in a specific way as shown in FIG. 2, said embodiment is described in detail in the following. The circuit arrangement comprises a transformer 1 with a transformer core 2 for multiple use according to the invention. Two windings 4 and 5 are arranged on the primary side 3 of the transformer 1, which form a winding with center tap 6. A positive direct voltage $+U_B$ is present at the center tap 6. A controlled switch Si is provided in the feed line 7 to winding 5, which connects the winding 5 in the closed position to a zero potential 0. A controlled switch S2 is provided in the feed line 8 to winding 4, which connects the winding 4 in the closed position with zero potential 0.

On the secondary side of the transformer 1, a switching power supply 9 and a drive pulse transmission 10 are formed in connection with the primary side 3. The switching power supply 9 comprises a first secondary winding 11, to which a rectifier 12 is connected. A capacitor 13, preferably in the form of an electrolyte capacitor, as well as a non-depicted control are connected to the output terminals of the rectifier 12. This control is used to maintain a desired value for the voltage at capacitor 13. In order to form the drive pulse transmission 10, a second secondary winding 14 is provided on the transformer core 2. The gate G of a FET transistor 15 is connected to one terminal of this secondary winding 14 via the in-series connection of two Z-diodes Z1 and Z2 with connected cathodes, and the source S of the FET-transistor 15 is connected to the other terminal. A capacitor 16 can be connected parallel to the gate-source path, as shown, if the capacitance between gate and source terminal of the FET transistor 15 to be actuated is not sufficient.

FIG. 2 shows signal and voltage curves at the various components of the inventive circuit arrangement, including the voltage data. In the example used for the dimensioning of the circuit arrangement, it is assumed that the positive direct voltage $+U_B$ is 10 V, the voltage at capacitor 13 of the switching power supply 9 is adjusted to be 16 V, the voltage at the gate G of the FET transistor 15 consequently is 12 V, that the number of turns for the two windings 4 and on the primary side 3 is 10 each, meaning that for the first secondary winding 11 being n=4 and that for the second secondary winding being n=8. Furthermore, the two Z-diodes have the same voltage, which is assumed to be 20 V. The pulse duty factor for switching on the two controlled switches S1 and S2 is 80%.

Starting with the above-mentioned dimensioning, FIG. 2 shows seven curves with their essential values in dependence on the time and their mutual assignment in time. Curve 21 shows the actuation of the controlled switch S1; curve 22 shows the actuation of the controlled switch S2, respectively between the conditions "on" and "off." The curve 23 displays the magnetizing of the transformer core 2 between the values +B and −B and shows their saw-tooth like course, in accordance with the switching on of the current between battery voltage +$U_B$ and the zero potential 0 that is caused by the switches S1 and S2. The course of the voltage on line 7 is shown in FIG. 1 with curve 24. A voltage value of between −30 V and +50 V is reached here owing to the Z-diodes Z1 and Z2. The voltage above the first secondary winding, which fluctuates between +4 V and −4 V, is shown with curve 25. Curve 26 shows the voltage above the second secondary winding 14, which ranges from +32 V to −32 V and takes the same course as the curve 25. Finally, the thickly drawn curve 27 in FIG. 2 represents the voltage course at the capacitor 16 or the gate G of the FET transistor 15. For a better recognition of the interaction, this curve 27 is superimposed on the thinly drawn curve 26.

According to the invention, the magnetic excitation of the transformer core 2, preferably composed of ferrite material, can occur in both directions, meaning the windings 4 and 5 on the primary side 3 are actuated from different poles. This occurs with the aid of the controlled switches S1 and S2. In this case, the direction depends on whether the switch S1 or the switch S2 are clocked. The switches S1 and S2 are clocked with high frequency, preferably with several 100 kHz, to be able to realize small structural designs. The switch-on pulse duty factor for the two controlled switches S1 and S2 is selected according to the invention such that it is higher than 50%, preferably around 80%. As a result of this, the voltage present at the windings for the switched-on condition of one of the switches S1 or S2 is lower than for the switched-off condition.

The primary side 3, together with the first secondary winding 11 as well as the rectifier 12 and the capacitor 13, forms the switching power supply 9. As a result of using the rectifier 12, it is unimportant whether the winding 5 is clocked via the switch S1 or whether the winding 4 is clocked via the switch S2. A blocking oscillator is advantageously created with this arrangement. The control circuit not shown here ensures that the voltage developing at the capacitor 13 has the desired specified value.

The drive pulse transmission is formed by the primary side 3 of the transformer 1 and the second secondary winding 14 of a pulse transformer, which generates rectangular pulses at the winding 14; see curve 26 in FIG. 2. Owing to the fact that the switch-on pulse duty factor for switches S1 and S2 is higher than 50%, lower voltages develop during the long switch-on phase than during the switch-off phase. This rectangular signal is transmitted to the capacitor 16 via the two Z-diodes Z1 and Z2 with connected cathodes, which are connected in series and are switched anti-serial. As a result of this, the capacitor is charged up to the respective voltage. The Z-diodes Z1 and Z2 are dimensioned identically and advantageously in such a way that they avoid being discharged by the voltage developing during the switch-on period.

The capacitor 16 can be omitted if the gate capacity of the FET transistor 15 to be switched is sufficient. The frequency for changing the polarity of the magnetizing is relatively low, for example only a few 100 Hz.

The invention at hand provides for a multiple use of a transformer core. In particular, it achieves a reduction in the total expenditure for producing a supply-voltage independent, stabilized voltage and for actuating a FET transistor, wherein this transistor in particular can also be an electrically floating one and a MOSFET transistor. Such transistors are used, for example, in controlled half-bridge or full-bridge circuits. That is why the invention at hand can be used with particular advantage in control devices for high-pressure gas discharge lamps, which are preferably used in motor vehicle headlamps.

I claim:

1. A circuit arrangement for multiple use of a transformer comprising:

a transformer comprising a transformer core, a primary side including a primary winding with a center tap defining two primary windings and a secondary side including two separate secondary windings;

separate feed lines connected respectively to the two primary windings and each line including a controlled switch for actuating a magnetic circuit in the transformer core by changing polarities on the primary side of the transformer;

a rectifier connected to a first one of the secondary windings for forming a switching power supply and being supplied with energy via the first secondary winding; and an FET transistor coupled to a second one of the secondary windings for forming a driving pulse transmission and being supplied with driving pulses via the second secondary winding.

2. The circuit arrangement according to claim 1, wherein the controlled switches in the feed lines of the primary windings have a switch-on pulse duty factor that is higher than 50%.

3. The circuit arrangement according to claim 2, wherein the switch-on pulse duty factor is approximately 80%.

4. The circuit arrangement according to claim 1, wherein the controlled switches in the feed lines to the primary windings are clocked.

5. The circuit arrangement according to claim 4, wherein the controlled switches are clocked at a frequency of several hundred kHz.

6. The circuit arrangement according to claim 1, and further comprising two in-series Zener diodes having connected cathodes connected between the FET transistor and the second secondary winding.

7. The circuit arrangement according to claim 6, and further including a capacitor connected between the gate and the source terminal of the FET transistor.

8. The circuit arrangement according to claim 7, wherein the FET transistor is electrically floating.

9. The circuit arrangement according to claim 8, wherein the FET transistor comprises a MOSFET transistor, and the circuit arrangement is for generating an independent, stabilized voltage and for actuating the MOSFET transistor.

10. A method for supplying energy to a high-pressure gas discharge lamp, comprising utilizing the circuit arrangement according to claim 1 in a control device for energizing the high-pressure discharge lamp.

* * * * *